US007001578B2

(12) United States Patent
Nayfeh et al.

(10) Patent No.: US 7,001,578 B2
(45) Date of Patent: Feb. 21, 2006

(54) FAMILY OF DISCRETELY SIZED SILICON NANOPARTICLES AND METHOD FOR PRODUCING THE SAME

(75) Inventors: Munir H. Nayfeh, Urbana, IL (US); Gennadey Belomoin, Wheeling, IL (US); Satish Rao, Reston, VA (US); Joel Therrien, Grafton, MA (US); Sahraoui Chaieb, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 10/829,486

(22) Filed: Apr. 22, 2004

(65) Prior Publication Data

US 2004/0197255 A1    Oct. 7, 2004

Related U.S. Application Data

(63) Continuation of application No. 09/990,250, filed on Nov. 21, 2001, now Pat. No. 6,743,406, which is a continuation-in-part of application No. 09/426,389, filed on Oct. 22, 1999, now Pat. No. 6,585,947.

(51) Int. Cl.
*C01B 33/02* (2006.01)

(52) U.S. Cl. .................................................. 423/348

(58) Field of Classification Search ............... 423/348; 205/656, 674, 686
See application file for complete search history.

(56) References Cited

U.S. PATENT DOCUMENTS 3,597,624 A    8/1971    Weiner (Continued)

FOREIGN PATENT DOCUMENTS

EP         0 354 141        2/1990

OTHER PUBLICATIONS

G. Allan, C. Delerue, M. Lannoo, "Nature of Luminescent Surface States of Semiconductor Nanocrystallites", Physical Rev. Lett., vol. 76, No. 16, Apr. 15, 1996, pp. 2961-2964.

(Continued)

*Primary Examiner*—Colleen P. Cooke
(74) *Attorney, Agent, or Firm*—Greer, Burns & Crain, Ltd.

(57) ABSTRACT

A family of discrete and uniformly sized silicon nanoparticles, including 1 (blue emitting), 1.67 (green emitting), 2.15 (yellow emitting), 2.9 (red emitting) and 3.7 nm (infrared emitting) nanoparticles, and a method that produces the family. The nanoparticles produced by the method of the invention are highly uniform in size. A very small percentage of significantly larger particles are produced, and such larger particles are easily filtered out. The method for producing the silicon nanoparticles of the invention utilizes a gradual advancing electrochemical etch of bulk silicon, e.g., a silicon wafer. The etch is conducted with use of an appropriate intermediate or low etch current density. An optimal current density for producing the family is ~10 milli Ampere per square centimeter (10 mA/cm$^2$). Higher current density favors 1 nm particles, and lower the larger particles. Blue (1 nm) particles, if any appreciable quantity exist depending on the selected current density, may be removed by, for example, shaking or ultrasound. After the etch, the pulverized wafer is immersed in dilute HF for a short time, while the particles are still connected to the wafer to weaken the linkages between the larger particles. This may be followed by separation of nanoparticles from the surface of the silicon. Once separated, various methods may be employed to form plural nanoparticles into crystals, films and other desirable forms. The nanoparticles may also be coated or doped. The invention produces the family of a discrete set of sized particles and not a continuous size distribution. Particles may be isolated from the family, i.e., it is possible to produce any one of the sizes of particles from the family after the basic method steps have been executed to produce the family of particles.

1 Claim, 1 Drawing Sheet

U.S. PATENT DOCUMENTS

| | | | |
|---|---|---|---|
| 4,931,692 | A | 6/1990 | Takagi et al. |
| 5,308,804 | A | 5/1994 | Lee |
| 5,527,386 | A | 6/1996 | Statz |
| 5,537,000 | A | 7/1996 | Alivisatos et al. |
| 5,561,679 | A | 10/1996 | Mannik et al. |
| 5,690,807 | A | 11/1997 | Clark, Jr. et al. |
| 5,695,617 | A | 12/1997 | Graiver et al. |
| 5,703,896 | A | 12/1997 | Pankove et al. |
| 5,714,766 | A | 2/1998 | Chen et al. |
| 5,747,180 | A | 5/1998 | Miller et al. |
| 5,770,022 | A | 6/1998 | Chang et al. |
| 5,881,200 | A | 3/1999 | Burt |
| 5,891,548 | A | 4/1999 | Graiver et al. |
| 5,906,670 | A | 5/1999 | Dobson et al. |
| 5,932,889 | A | 8/1999 | Matsumura et al. |
| 5,942,748 | A | 8/1999 | Russell et al. |
| 6,060,743 | A | 5/2000 | Sugiyama et al. |
| 6,326,311 | B1 | 12/2001 | Ueda et al. |
| 6,407,424 | B1 | 6/2002 | Forbes |
| 6,410,934 | B1 | 6/2002 | Nayfeh et al. |
| 6,456,423 | B1 | 9/2002 | Nayfeh et al. |
| 6,585,947 | B1 | 7/2003 | Nayfeh et al. |
| 6,597,496 | B1 | 7/2003 | Nayfeh et al. |
| 6,743,406 | B1 | 6/2004 | Nayfeh et al. |

OTHER PUBLICATIONS

D. Andsager, J. Hilliard, J.M. Hetrick, L.H. AbuHassan, M. Plisch, M.H. Nayfeh, "Quenching of Porous Silicon Photoluminescence by Deposition of Metal Adsorbates", J. Appl. Phys., vol. 74, No. 74, No. 7, Oct. 1, 1993, pp. 4783-4785.

D. Andsager, J. Hilliard, M.H. Nayfeh, "Behavior of Porous Silicon Emission Spectra During Quenching by Immersion in Metal Ion Solutions", Appl. Phys. Lett., vol. 64, No. 9, Feb. 28, 1994, pp. 1141-1143.

D. Andsager, J.M. Hetrick, J. Hilliard, M.H. Nayfeh, "Diffusion of Copper in Porous Silicon", J. Appl. Phys., vol. 77, No. 9, May 1, 1995, pp. 1-4.

Anton Fojtik, Armin Henglein, "Luminescent colloidal silicon particles", Chemical Physics Letters 221, Apr. 29, 1994, pp. 363-367.

Gennadiy Belomoin, Joel Therrien, and Munir Nayfeh, "Oxide and hydrogen capped ultrasmall blue luminescent Si nanoparticles", Applied Physics Letters, vol. 77, No. 6, Aug. 7, 2000, pp. 779-780.

M.L. Brongersma, K.S. Min, E. Boer, T.Tambo, A. Polman, and H.A. Atwater, "Tailoring the Optical Properties of Si Nanocrystals in $SiO_2$ Materials Issues and Nanocrystal Laser Perspectives", Mat. Res. Soc. Symp. Proc., vol. 486, 1998 Materials Research Society, pp. 213-217.

L.E. Brus, P.F. Szajowski, W.L. Wilson, T.D. Harris, S. Schuppler, and P.H. Citrin, "Electronic Spectroscopy and Photophysics of Si Nanocrystals: Relationship to Bulk c-Si and Porous Si", J. Am. Chem. Soc., 1995, vol. 117, pp. 2915-2922.

L.T. Canham, "Silicon Quantum Wire Array Fabrication by Electrochemical and Chemical Dissolution of Wafers", Appl. Phys. Lett., vol. 57, No. 10, Sep. 3, 1990, pp. 1046-1048.

R.P. Chin, Y.R. Shen, V. Petrova-Koch, "Photoluminescence from Porous Silicon by Infrared Multiphoton Excitation" Science, vol. 270, Nov. 3, 1995, pp. 776-778.

G.M. Credo, M.D. Mason, and S.K. Buratto, "External quantum efficiency of single porous silicon nanoparticles", Applied Physics Letters, vol. 74, No. 14, Apr. 5, 1999, pp. 1978-1980.

A.G. Cullis, L.T. Canham, P.D.J. Calcott, "The Structural and Luminescence Properties of Porous Silicon", J. Appl. Phys., vol. 82, No. 3, Aug. 1, 1997, pp. 909-965.

D.J. DiMaria, J.R. Kirtley, E.J. Pakulis, D.W. Dong, T.S. Kuan, F.L. Pesavento, T.N. Theis, J.A. Cutro, and S.D. Brorson, "Electroluminescence studies in silicon dioxide films containing tiny silicon islands", J. Appl. Phys., vol. 56, No. 2, Jul. 15, 1984, pp. 401-416.

J. Erland, P. Yu, S.I. Bozhevolnyi, J.M. Hvam, N.N. Ledentsov, "Second harmonic spectroscopy of semiconductor nanostructures", Quantum Electronics and Laser Science Conference Technical Digest, May 1999, pp. 233-234.

F. Koch, "Models and Mechanisms for the Luminescence of Porous Si", Mater. Res. Soc. Symp. Proc., vol. 298, 1993, pp. 319-329.

J. Gole, D. Dixon, "Evidence for Oxide Formation from the Single and Multiphoton Excitation of a Porous Silicon Surface or Silicon 'Nanoparticles'", J. Appl. Phys., vol. 83, No. 11, Jun. 1, 1998, pp. 5985-5991.

E. Hanamura, "Very Large Optical Nonlinearity of Semiconductor Microcrystallites", Physical Rev. B, vol. 37, No. 3, Jan. 15, 1988, pp. 1273-1279.

J.L. Heinrich, C.L. Curtis, G.M. Credo, K.L. Kavanagh, M.J. Sailor, "Luminescent Colloidal Silicon Suspensions from Porous Silicon", Science, vol. 255, Jan. 3, 1992, pp. 66-68.

J. Hilliard, D. Andsager, L. Abu Hassan, H.M. Nayfeh, M.H. Nayfeh, "Infrared Spectroscopy and Secondary Ion Mass Spectrometry of Luminescent, Nonluminescent and Metal Quenched Porous Silicon", J. Appl. Phys., vol. 76, No. 4, Aug. 15, 1994, pp. 2423-2427.

J.E. Hilliard, H.M. Nayfeh, M.H. Nayfeh, "Re-Establishment of Photoluminescence in Cu Quenched Porous Silicon by Acid Treatment", J. App. Phys., vol. 77, No. 8, Apr. 15, 1995, pp. 4130-4132.

Kouichi Murakami and Tetsuya Makimura, Silicon nanoparticles with visible light emission -Laser ablation-, Oyo Buturi, vol. 67, No. 7, pp. 817-821, Jul. 1998 (with verified translation).

K.A. Littau, P.J. Szajowski, A.J. Muller, A.R. Kortan, and L.E. Brus, "A Luminescent Silicon Nanocrystal Colloid via a High-Temperature Aerosol Reaction", The Journal of Physical Chemistry, vol. 97, No. 6, 1993, pp. 1224-1230.

L.A. Chiu, A.A. Seraphin, and K.D. Kolenbrander, "Gas Phase Synthesis and Processing of Silicon Nanocrystallites: Characterization by Photoluminescence Emission Spectroscopy", Journal of Electronic Materials, vol. 23, No. 3, 1994, pp. 347-354.

Tetsuya Makimura, Yasuhiko Kunii and Kouichi Murakami, "Light Emission from Nanometer-Sized Silicon Particles Fabricated by the Laser Ablation Method", Jpn. J. Appl. Phys., vol. 35, (1996), pp. 4780-4784.

M. Nayfeh, "Fabrication of Nanometer Scale Structures", SPIE Institutes, vol. IS 10, (1993), pp. 200-217.

M.H. Nayfeh, N. Rigakis, Z. Yamani, "Photoexcitation of Si-Si Surface States in Nanocrystallites", Physical Review B, vol. 56, No. 4, Jul. 15, 1997, pp. 2079-2084.

M.H. Nayfeh, N. Rigakis, Z. Yamani, "Photoexcitation of Si-Si Radiative Surface States in Nanocrystallites", Mat. Res. Soc. Symp. Proc., vol. 486, 1998, pp. 243-248.

M.H. Nayfeh, Z. Yamani, O. Gurdal, A. Alaql, "Nanostructure of Porous Silicon Using Transmission Microscopy", Mat. Res. Soc. Symp. Proc., vol. 536, 1999.

M. Nayfeh, O. Akcakir, J. Therrien, Z. Yamani, N. Barry, W. Yu, and E. Gratton, "Highly nonlinear photoluminescence threshold in porous silicon", Applied Physics Letters, vol. 75, No. 26, Dec. 27, 1999, pp. 4112-4113.

U. Neuwald, A. Feltz, U. Memmert, R.J. Behm, "Chemical Oxidation of Hydrogen Passivated Si(111) Surfaces in $H_2O_2$", J. Appl. Phys., vol. 78, No. 6, Sep. 15, 1995, pp. 4131-4136.

A. Pasquarello, M.S. Hybertsen, R. Car, "Si 2p Core-Level Shifts at the Si(001)-$SiO_2$ Interface: A First-Principles Study", Phys. Rev. Lett., vol. 74, No. 6, Feb. 6, 1995, pp. 1024-1027.

L. Pavesl, L. Dal Negro, C. Mazzoleni, G. Franzo and F. Prlolo, "Optical gain in silicon nanocrystals", Nature, vol. 408, Nov. 23, 2000, pp. 440-443.

S.I. Raider, R. Flitsch, M.J. Palmer, "Oxide Growth on Etched Silicon in Air at Room Temperature", J. Electrochem. Soc., vol. 122, No. 3, Mar. 1975, pp. 413-418.

N. Rigakis, J. Hilliard, L. Abu Hassan, J. Hetrick, D. Andsager, M.H. Nayfeh, "Effect of Oxidation Treatments on Photoluminescence Excitation of Porous Silicon", J. App. Phys., vol. 81, No. 1, Jan. 1, 1997, pp. 440-444.

N. Rigakis, Z. Yamani, L. Abu Hassan, J. Hilliard, M.H. Nayfeh, "Time-Resolved Measurements of the Photoluminescence of Cu-Quenched Porous Silicon", Appl. Phys. Lett., vol. 69, 1996, pp. 2216-2218.

S. Juen, K. Überbacher, J. Baldauf, K.F. Lamprecht, R. Tessadri, R. Lackner, R.A. Höpfel, "Technology and Photoluminescence of GaAs Micro- and Nanocrystallites", Superlattices and Microstructures, vol. 11, No. 2, 1992, pp. 181-184.

Shoutian Li, I.N. Germanenko, M.S. El Shall, "Semiconductor nanoparticles in contact: quenching of the photoluminescence from silicon nanocrystals by WO3 nanoparticles suspended in solution", Journal of Physical Chemistry B, vol. 102, No. 38, pp. 7319-7322, Sep. 17, 1998 (Abstract).

Shoutian Li, Stuart J. Silvers and M. Samy El-Shall, Luminescence Properties of Silicon Nanocrystals, Material Research Society Symposium Proceedings, vol. 452, 1997, pp. 141-146.

Shoutian Li, Silvers, JJ; El Sall, MS, "Luminescence Properties of Silicon Nanocrystals," Advances in Microcrystalline and Nanocrystalline Semiconductors, Symposium, Boston, MA, Dec. 2-4, 1996.

W.H. Thompson, Z. Yamani, L.H. Abu Hassan, J.E. Greene, M. Nayfeh, M.A. Hasan, "Room Temperature Oxidation Enhancement of Porous Si(001) Using Ultraviolet-Ozone Exposure", J. Appl. Phys., vol. 80, No. 9, Nov. 1, 1996, pp. 5415-5421.

W.H. Thompson, Z. Yamani, L. Abu Hassan, O. Gurdal, M. Nayfeh, "The Effect of Ultrathin Oxides on Luminescent-Silicon Nanocrystallites", Appl. Phys. Lett., vol. 73, No. 6, Aug. 10, 1998, pp. 841-843.

Sandip Tiwari, Farhan Rana, Hussein Hanafi, Allan Hartstein, Emmanuel F. Crabbé, and Kevin Chan, "A silicon nanocrystals based memory", Appl. Phys. Lett., vol. 68, No. 10, Mar. 4, 1996, pp. 1377-1379.

J. Wang, H.B. Jiang, W.C. Wang, J.B. Zheng, F.L. Zhang, P.H. Hao, X.Y Hou, X. Wang, "Efficient Infrared-Up-Conversion Luminescence in Porous Silicon: A Quantum-Confinement-Induced Effect", Phys. Rev. Lett., vol. 69, No. 22, Nov. 30, 1992, pp. 3252-3255.

E. Werwa, A.A. Seraphin and K.D. Kolenbrander, Excitation Intensity and Temperature Dependent Photoluminescence Behavior of Silicon Nanoparticles, Material Research Society Symposium Proceedings, vol. 452, 1997, pp. 129-134.

Z. Yamani, W.H. Thompson, L. Abu Hassan, M.H. Nayfeh, "Ideal Anodization of Silicon", Appl. Phys. Lett:, vol. 70, No. 25, Jun. 23, 1997, pp. 3404-3406.

Z. Yamani; S. Ashhab, A. Nayfeh, W.H. Thompson, M. Nayfeh, "Red to Green Rainbow Photoluminescence from Unoxidized Silicon Nanocrystallites", J. Appl. Phys., vol. 83, No. 7, Apr. 1, 1998, pp. 3929-3931.

Z. Yamani, N. Rigakis, M.H. Nayfeh, "Excitation of Size Selected Nanocrystallites in Porous Silicon", Appl. Phys. Lett., vol. 72, No. 20, May 18, 1998, pp. 2556-2558.

Z. Yamani, A. Alaql, J. Therrien, O. Nayfeh, M. Nayfeh, "Revival of Interband Crystalline Reflectance from Nanocrystallites in Porous Silicon by Immersion Plating", Appl. Phys. Lett., vol. 74, No. 23, Jun. 7, 1999, pp. 3483-3485.

Z. Yamani, O. Gurdal, A. Alaql, M.H. Nayfeh, "Correlation of Diffuse Scattering with Nanocrystallite Size in Porous Silicon Using Transmission Microscopy", J. Appl. Phys., vol. 85, No. 12, Jun. 15, 1999, pp. 8050-8053.

S. T. Yau, D. Saltz, M. H. Nayfeh, "Laser-Assisted Deposition of Nanometer Structures Using a Scanning Tunneling Microscope", Appl. Phys. Lett., vol. 57, No. 27, Dec. 31, 1990, pp. 2913-2915.

S.T. Yau, X. Zheng, M.H. Nayfeh, "Nanolithography of Chemically Prepared Si With a Scanning Tunneling Microscope", Appl. Phys. Lett., vol. 59, No. 19, Nov. 4, 1991, pp. 2457-2459.

Xinwei Zhao, Olaf Schoenfeld, Jun-ichi Kusano, Yoshinobu Aoyagi and Takuo Sugano, "Observation of Direct Transitions in Silicon Nanocrystallites", Jpn. J. Appl. Phys., vol. 33, Jul. 1, 1994, Pt. 2, No. 7A, pp. L899-L901.

Nayfeh et al., U.S. Appl. No. 09/426,204, entitled Silicon Nanoparticle Stimulated Emission Devices, filed Oct. 25, 1999; and.

Nayfeh et al., U.S. Appl. No. 09/426,389, entitled Silicon Nanoparticle and Method for Producing the Same filed Oct. 22, 1999; and.

Nayfeh et al., U.S. Appl. No. 09/496,506 entitled Silicon Nanoparticle Field Effect Transistor and Transistor Memory Device, filed Feb. 2, 2000; and.

Nayfeh et al., U.S. Appl. No. 09/572,121, entitled Silicon Nanoparticle Microcrystal Nonlinear Optical Devices, filed May 17, 2000; and.

Nayfeh et al., U.S. Appl. No. 09/781,147, entitled Silicon Nanoparticle Electronic Switches, filed Feb. 9, 2001; and.

Nayfeh et al., U.S. Appl. No. 09/990,250, entitled Family of Discretely Sized Silicon Nanoparticles and Method for Producing the Same, filed Nov. 21, 2001; and.

Nayfeh et al., U.S. Appl. No. 10/361,176, entitled Silicon Nanoparticle and Method for Producing the Same, filed Oct. 22, 1999.

Nayfeh et al., U.S. Appl. No. 10/374,683, entitled Coated Spherical Silicon Nanoparticle Thin Film UV Detector With UV Response and Method of Making, filed Feb. 23, 2003.

Fujii, M., Hayashi, S., Yamamoto, K., "Photoluminescence from B-Doped Si Nanocrystals," Journal of Applied Physics, American Institute of Physics, New York, vol. 83, No. 12, Jun. 15, 1998, pp. 7953-7957.

Levoska, J., Tyunina, M., Leppävuori, S., "Laser Ablation Deposition of Silicon Nanostructures," NanoStructured Materials, Elsevier, New York, Published Online Oct. 6, 1999, pp. 101-106.

Brus, L., "Luminescence of Silicon Nanocrystals and Porous Silicon," Japanese Journal of Applied Physics, Publication Office Japanese Journal of Applied Physics, Tokyo, JP, vol. 34, No. 34-1, Suppl., Jan. 1994, pp. 5-7.

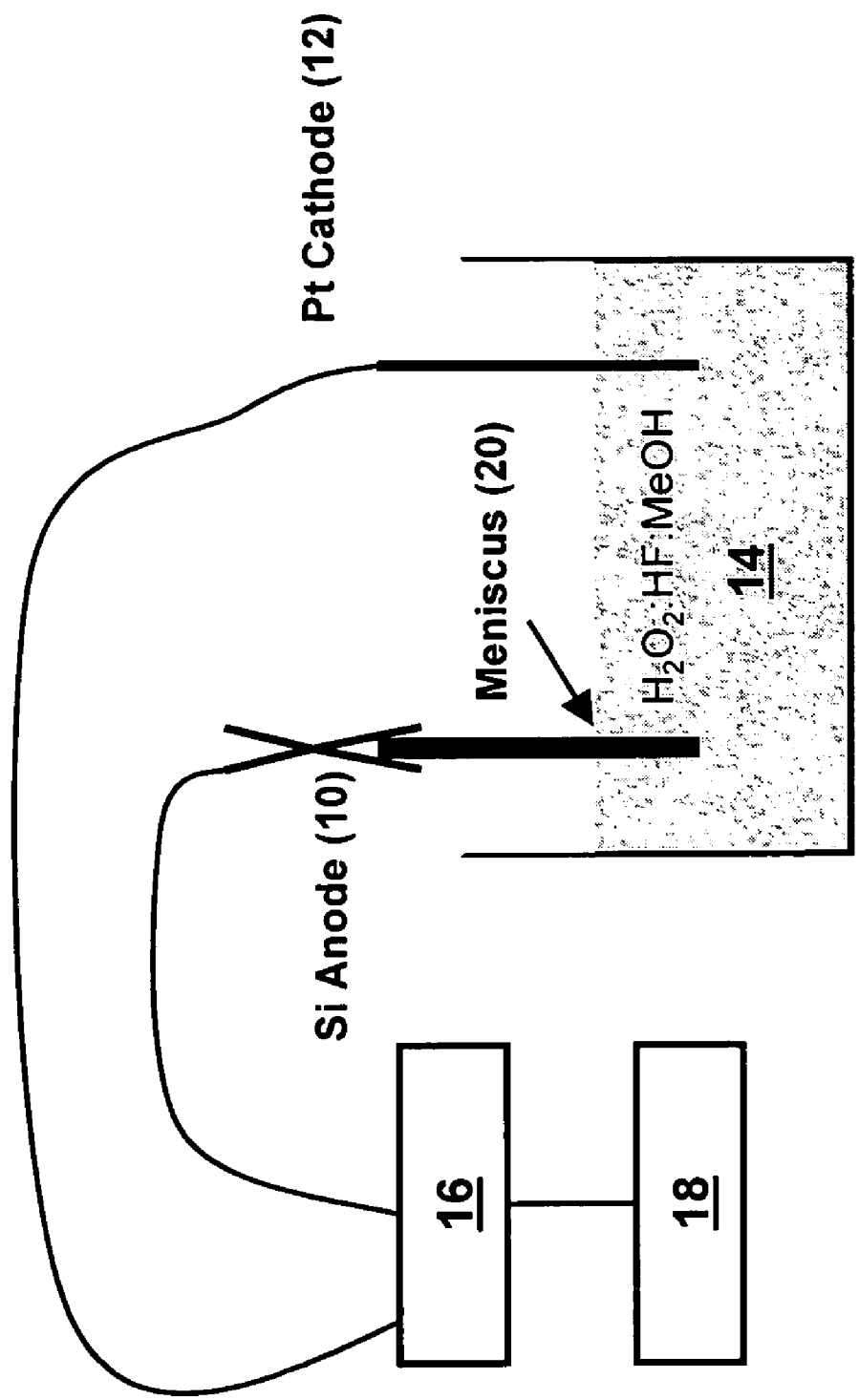

FAMILY OF DISCRETELY SIZED SILICON NANOPARTICLES AND METHOD FOR PRODUCING THE SAME

STATEMENT OF RELATED APPLICATIONS

This is a continuation of application Ser. No. 09/990,250, filed Nov. 21, 2001, now U.S. Pat. No. 6,743,406, which is a continuation-in-part of, and claims priority under 35 U.S.C. §120 from, Nayfeh et al. U.S. patent application Ser. No. 09/426,389, entitled SILICON NANOPARTICLE AND METHOD FOR PRODUCING THE SAME, filed Oct. 22, 1999, now U.S. Pat. No. 6,585,947.

FIELD OF THE INVENTION

The present invention generally concerns elemental silicon nanoparticles.

BACKGROUND ART

Silicon nanoparticles are an area of intense study. Nanoparticles that are below about 10 nm are of interest because the nanoparticles, when reduced to particular sizes not found in naturally occurring element silicon, exhibit properties unlike bulk silicon. Various techniques exist for producing silicon nanoparticles of random dimensions, and those processes sometimes produce silicon nanoparticles below 10 nm.

U.S. patent application Ser. No. 09/426,389, entitled SILICON NANOPARTICLE AND METHOD FOR PRODUCING THE SAME, incorporated by reference herein, discloses a method for producing quantities of uniformly sized 1 nm silicon nanoparticles. This ability to produce uniformly sized particles in quantity is an important advance in the state of the art.

SUMMARY OF INVENTION

The invention is a family of discretely and uniformly sized silicon nanoparticles, including 1 (blue emitting), 1.67 (green emitting), 2.15 (yellow emitting), 2.9 (red emitting) and 3.7 nm (infrared emitting) nanoparticles, and a method that produces the family. The nanoparticles produced by the method of the invention are highly uniform in size. A very small percentage of significantly larger particles are produced, and such larger particles are easily filtered out.

The method for producing the silicon nanoparticles of the invention utilizes a gradual advancing electrochemical etch of bulk silicon, e.g., a silicon wafer. The etch is conducted with use of an appropriate intermediate or low etch current density. An optimal current density for producing the family is ~10 milli Ampere per square centimeter (10 mA/cm$^2$). Higher current density favors 1 nm particles, and lower the larger particles. Blue (1 nm) particles, if any appreciable quantity exist depending on the selected current density, may be removed by, for example, shaking or ultrasound. After the etch, the pulverized wafer is immersed in dilute HF for a short time, while the particles are still connected to the wafer, to weaken the linkages between the larger particles. This may be followed by separation of nanoparticles from the surface of the silicon. Once separated, various methods may be employed to form plural nanoparticles into crystals, films and other desirable forms. The nanoparticles may also be coated or doped. The invention produces the family of a discrete set of sized particles and not a continuous size distribution.

Particles may be isolated from the family, i.e., it is possible to produce any one of the sizes of particles from the family after the basic method steps have been executed to produce the family of particles. The blue particles are preferably obtained prior to the HF immersion. Larger particles are obtained by additional procedures subsequent to the HF immersion. An isolation step is conducted to select a desired particle size from the family of particles after the above steps to produce the family of particle are conducted. According to a preferred embodiment, isolation is accomplished using steps of centrifuging, course filtering, and acid treatment. This protocol is effective in isolating particles of a given size with a high degree of uniformity. Chromatography may be used to further isolate particles of a given size with a high degree of uniformity since the sizes are discrete and well separated.

BRIEF DESCRIPTION OF THE DRAWING

The FIGURE illustrates preferred method for producing silicon nanoparticles in accordance with the present invention.

BEST MODE OF CARRYING OUT THE INVENTION

A discretely and uniformly sized family of silicon nanoparticles are provided by the method of the invention. Execution of the basic method steps includes a gradual advancing electrochemical etch of bulk silicon with low-intermediate current density. A density of ~10 milli Ampere per square centimeter (10 mA/cm$^2$) is optimal to produce the family. Higher current density favors 1 nm particles, and lower the larger particles. Blue (1 nm) particles, if any appreciable quantity exist depending on the selected current density, may be removed by, for example, shaking or ultrasound. After the etch, the pulverized wafer is immersed in dilute HF for a short time, while the particles are still connected to the wafer, to weaken the linkages between the larger particles. This may be followed by separation of nanoparticles from the surface of the silicon. Once separated, various methods may be employed to form plural nanoparticles into crystals, films and other desirable forms. The nanoparticles may also be coated or doped. The invention produces the family of a discrete set of sized particles and not a continuous size distribution. The discrete sizes in the family of particles are 1 (blue emitting), 1.67 (green emitting), 2.15 (yellow emitting), 2.9 (red emitting) and 3.7 nm (infrared emitting) nanometer nanoparticles. The silicon nanoparticles may also be combined or reconstituted into crystals, solids, films, etc.

The method for creating the elemental silicon nanoparticle family of the invention is an electrochemical treatment which involves gradually advancing bulk silicon, e.g., a wafer, into a chemical etch bath at a low speed while etching is taking place, in the presence of an external current. A meniscus forms as a very thin slice of the silicon that is at the interface of etchant solution and air. The slow advance of the silicon creates a large section, which is meniscus-like. In effect, a traveling meniscus is created as the silicon material is gradually advanced into the etchant bath while electrical current is applied. At this point, any blue (1 nm) particles may be removed by shaking, scraping, or, preferably, gentle ultrasound. After the etch (and any removal of blue particles), the pulverized wafer is immersed in dilute HF for a short time, e.g., about 1 minute, while the particles are still connected to the substrate to weaken the linkages between the lager particles. The overall process enriches the ultra small substructure of the material. Moreover, it makes the top skin of the silicon material extremely fragile. The ultra-small structures, which are silicon nanoparticles, may then be separated from the material and recovered. Our procedure, using the intermediate-low current densities and the dilute post HF immersion primarily produces the larger green, yellow, red and infrared nanoparticles of the present family. Further separation or filtering is effective in isolating particles of a given size with a high degree of uniformity.

A preferred embodiment of the method is illustrated in the FIGURE. The preferred embodiment uses a silicon single crystalline wafer 10, a platinum cathode 12 in the form of a sheet or a wire, HF acid, $H_2O_2$ liquid, and other chemicals that might include methanol or water for an etchant bath 14. The preferred silicon wafers are (100) or (111) oriented, 1–10 ohm-cm resistivity, p-type boron-doped silicon.

The wafer 10 and the cathode 12 are connected to a constant current source 16 driven by a power source 18. The cathode 12 is vertically or horizontally immersed in the etchant. The silicon wafer 10 is gradually advanced. By way of example, it has been found that a speed of about 1 mm per hour produces good results. As the silicon wafer 10 is gradually immersed into the solution, at a distance from the cathode 12, a meniscus forms at the point where the silicon wafer 10 is interfaced with a surface 20 of the etchant bath 14. While advancing the wafer, the current is maintained.

The current density will determine the sizes of particles formed. An optimal current density for forming the range of particles is ~10 milli Ampere per square centimeter (10 $mA/cm^2$). At that level, though, a very small percentage of the blue (1 nm) particles will form. Raising the current density produces more 1 nm particles at the expense of larger particle production. For example, 20 $mA/cm^2$ has been found to produce good results that favor production of 1 nm particles. Reducing current density to 10 $mA/cm^2$ produces the family of particles. Further reduction to 5 $mA/cm^2$ further favors larger particles. If the goal is to produce only 1 nm particles, then the current density is increased. At the higher current density, e.g., 20 $mA/cm^2$, the most stable size is the 1 nm, the smallest stable size we have been abundantly producing. The procedure is straightforward and always leads to the monodispersed 1 nm nanoparticles. At the intermediate densities or low current densities, several larger sizes of particles (1.67, 2.15, 2.9, or 3.7 nm) result from the etching procedure, excluding (or including to a much lesser degree) the smallest 1 nm ones. The 1 nm particles, if any, are very tenuously connected to the silicon substrate and other particles, however the larger sizes have stronger linkages to each other and the substrate. Thus, following the etch and prior to the HF immersion it is possible to shake off those smallest ones (if any), e.g., by a gentle ultrasound, a shaking, or a scraping. At this point, the recovery method for the larger sizes diverges. After the etch, the pulverized wafer is immersed in dilute HF for a short time, e.g., about 1 minute, while the particles are still connected to the substrate to weaken the linkages between the larger particles. The wafer is transferred to the liquid of choice, and ultrasound is used to shake the particles off, allowing them to be dispersed into the solution. At this point the solution then contains a mixture of the family of sizes excluding the 1 nm size nanoparticles.

During etching of the bulk silicon, a magnetic stirrer may be used to ensure that the chemicals of the etchant stay uniformly mixed. The meniscus travels along the silicon wafer 10 due to the gradual immersion and etches to create silicon nanoparticle structures on the top skin of the silicon material. By utilizing $H_2O_2$ (as a catalyst), and significant current, a high etching rate is realized which produces films of interconnected substructure with much reduced sizes, approaching the limit of size. This favors 1 nm particle production. Reducing current to comparably low or intermediate amounts favors producing the family of larger particles. Moreover, the lateral anodization creates a high current concentration in the top skin of the silicon wafer 10, hence the high etching rate leading to the ultra-small nanoparticle structures, especially at the meniscus (air—liquid interface). Advancing the sample in the etchant slowly and uniformly results in a large area of the sample that is meniscus-like, hence enriching the ultra small nano substructure.

As discussed, gentle removal techniques can separate the 1 nm particles immediately following the etch. The family of larger green, yellow, red and infrared silicon nanoparticles is then obtained by first separating the silicon wafer 10 from the etchant bath 14. The silicon wafer may be rinsed, for example, with methanol. The wafer is then immersed in dilute HF for a short time, while the particles are still connected to the substrate. The post treatment weakens the linkages between the larger particles. We then separate the silicon nanoparticles from the surface of the silicon wafer 10 by force, e.g. an ultrasound treatment. In a large scale production of nanoparticles, it may be preferable to drain or move the etchant bath as a manner of separating the etchant bath 14 and silicon wafer 10. The silicon wafer 10 is then preferably immersed in an ultra sound acetone (ethanol, methanol or any other solvent) bath for a brief period of time. Under the ultra sound treatment, the very top layer of the silicon film on the wafer 10, a weakly interconnected luminescent nanostructure network, crumbles into the family of silicon nanoparticles to create a nanoparticle colloid. The colloid is stable as shown by the fact that it retains characteristic emission over weeks, indicating that the silicon nanoparticles are small enough to stay in suspension. Generally, any method which separates the silicon nanoparticles from the etched anode is suitable, but the solvent with breaking force supplied by ultrasound waves is preferred. Shaking, scraping or banging are exemplary, non-exhaustive, alternative techniques that may be used to break off the particles. The ultrasound appears to work best, though.

Once a colloid of the larger green, yellow, red and infrared particles is obtained, these larger particles may also be isolated from each other by additional processing. In a preferred method of isolation, we centrifuge the mix of particles. The residue consists of the largest particles (red and infrared) in the mix. The smaller green/yellow particles stay in suspension in the liquid. The residue of the centrifuge will then be recovered and re-dissolved in fresh solvent and sonificated (to separate red and infrared from the residue). The largest red emitting particles will stay in suspension, while the residue (infrared) is discarded. A harsher solvent treatment and ultrasound may be conducted to obtain the largest infrared from the residue. The green particles may be isolated by additional sonification/or and the addition of a minute quantity (e.g., a drop of HF) acid with an ultrasound to break up the green from the yellow particles. The yellow particles are more difficult to separate from the green. Chromatography is best to accurately separate the yellow and green particles. Accordingly, the initial isolation process may be followed by commercial Gel permeation chromatography to separate the yellow from the green ones further, if necessary, or to obtain additional accuracy in separation of the other particles, as well. The particles are separated into vials each containing particles of uniform size, with near 90–100% efficiency.

A commercial method of isolating particles is chromatography. The commercial Gel permeation chromatography is also known as size exclusion chromatography and is based on separation by size. There is no dependence on the molecular weight. The basic setup is a column that is packed with porous gel beads through which a solvent flows. The sample is injected into the solvent upstream of the column. The column is packed with gel beads, composed of a polymer, that have pores of various sizes on them. The smallest pores define the lower limit of sizes that the column can separate. Particles that are as small as or smaller than this lower limit have the largest fraction of pores available for them to diffuse into. The upper limit of size that can be separated is determined by the largest pore size in the beads. The gel does not trap anything larger. With a continuous distribution of pore sizes, separation is possible for all particles sizes between the upper and lower limits. The separation occurs due to the time delay in the particle's drift though the column caused by the particles being trapped in the pores. The larger the number of available pores, the slower the particles traverse the column, leading to a physical separation of particle sizes as a function of the time they exit the column resulting in a distribution of five discrete highly uniform size distributions. The mix is separated into vials each containing particles of uniform size with near 90–100% efficiency.

What is left of the silicon wafer 10 can be recycled (used as a source for creating additional nanoparticles) two to three times or even more depending upon its thickness. This cuts the cost of the raw material.

The silicon nanoparticles of the invention have good electronic, chemical and structural qualities. The preferred use of $H_2O_2$ as part of the etchant solution to produce the silicon nanoparticles provides a high quality hydrogen coating (termination or passivation), dominated by an ideal stretching mode with no di- or tri hydrides that act as nonradiative electronic traps. The high quality coating fully protects the silicon particles from uncontrollable low quality post interactions in the ambient atmosphere that would generate nonradiative traps. Moreover, the preferred etchant leaves no oxygen on the particles. After the electrochemical etching process is complete, the hydrogen coating, however, can be replaced by a high quality oxide coating by post immersion in $H_2O_2$. This is due to the fact that the high quality nature of the hydrogen termination makes it possible for hydrogen to be substituted with an ultra thin high quality oxide termination. This is a self-limiting process that yields oxide layers of 4 Å thick on bulk Si, with a trap density of less than $1/10^{14}$. The oxide coating provides additional protection and hardening against laser damage. The optical properties of the silicon nanoparticles are not compromised by such a high quality oxide termination (passivation). As to the chemical quality, $H_2O_2$ is an oxidant which will remove nearly every kind of contamination (organic material, metals, alkalines, and metal hydroxides) from silicon surfaces by oxidative dissolution and complex formation.

The silicon nanoparticles may be further processed by manipulation of their nanosurface. An oxide coating may be applied, for example, as discussed above. Immersion in $H_2O_2$, after the etching process is complete but either before or after the separation step will accomplish an oxide coating. Immersion for a sufficient time (45 minutes to an hour has been found suitable) allows $H_2O_2$ to remove hydrogen coating produced by the etchant and replaces it with a high quality oxide coating, one monolayer thick with very little increase in size, and without appreciable reduction in blue emission efficiency of the nanoparticles.

Alternative coatings are also possible. The silicon nanoparticles have application as an alternative markers to dyes used in biological applications since even a single particle can be detected due to its emissions in response to stimulations. In such biological applications, it may be desirable to coat the silicon nanoparticles with biological material. Such coatings can be chosen to selectively control their attachment to components within an organism, cell or to biological molecules.

Emission characteristics of the silicon nanoparticles of the invention may be tailored by doping to tune the emission bands. As an example, doping of 1 nm particles with aluminum shifts emission into the blue direction, whereas doping with erbium produces intense infrared radiation at 1.54 $\mu$m. Doping may be accomplished by a slight alteration of the above described method for producing the silicon nanoparticles. Precursor salts that bear the dopant are prepared in an aqueous solution. Before separation of the silicon nanoparticles from the silicon anode 10, the etchant solution 14 is drained and replaced by the salt solution. Alternatively, the anode 10 may be removed and placed in the salt solution. Electrodes 10, 12 are then biased to draw the dopant ions towards the silicon wafer anode 10. The dopant may alternatively be implanted by ion bombardment. After deposition or ion implantation, the silicon wafer anode 10 is heat treated in an inert atmosphere to drive the dopant into the material. Once this is achieved, the doped silicon nanoparticles may be separated from the anode and collected, as described above.

Molding of the silicon nanoparticles produces geometry of choice. A paste of individual silicon nanoparticles may be prepared. The silicon nanoparticles may also be placed in a matrix of choice to form a thin film, or molded in any geometry or shape, or they may be implanted in material mix during manufacturing as an invisible label. Precipitation of the colloid silicon nanoparticles from a volatile solvent such as acetone, ethanol or methanol can be used to prepare thin films or superlattices on a substrate of choice, such as device quality silicon used in electronic and electrooptic devices. Nanoparticle colloids may also be solidified by applying an electric field to the disordered fluid. Silicon nanoparticles take only milliseconds to form luminescent "pearl" chains. A few seconds later, the chains aggregate into blue luminescent columns.

The emission characteristics of the undoped silicon nanoparticles of the invention are unlike those of bulk silicon, which is highly inefficient. Upon irradiation with 355 nm UV radiation, emission from a 1.0 nm silicon nanoparticle colloid of the invention is found to be dominated by an extremely strong deep blue band centered at 390 nm, with a structureless weak tail (690–490 nm), and a weak infrared band centered at 760 nm. On the other hand, when a 1.67 nm particle colloid is excited with 480 nm, intense green emission is observed. When a 2.9 nm particle colloid is excited by 540 nm radiation, intense red emission is observed. When a colloid of 3.7 nm particles are excited by UV at 365 nm, infrared radiation is observed.

The excitation, that is the absorption monitored at a specific emission wavelength, was recorded (product of absorption and emission). The spectra were recorded on a photon counting spectro-fluorometer with a Xe arc lamp light source and 4 nm bandpass excitation and emission monochrometers, with suitable filtering and correction for spectral response. We mapped out the excitation of the mix of the discrete particle family in the range 250 nm and 800 nm, while monitoring the emission in the range 400–700 nm. We used the mapping to identify the resonance excitation structure. A resonance structure was indicated at 3.44, 2.64, and 2.39, and 2.11 eV. This resonance structure produces emission bands with maxima at 410, 520, 570, and 600 nm. According to quantum confinement models, the absorption and emission photon energies correlate with the size of particles. This absorption resonance can be associated with the HUMO-LUMO edge. Therefore, we pair the diameter values d (in nm) with excitation resonance $E_g$ (in eV) as follows (d, $E_g$): (1.03, 3.44); (1.67, 2.64); (2.15, 2.39); and (2.9, 2.11). The fifth particle is (3.7, 1.79).

Over time, 5 to 100 μm crystals have formed in colloids. Since organization or self-assembly (to produce crystals) requires uniform particles, we expect, upon crystallization, segregation according to size. Sample colloidal crystallites were placed on glass and back-illuminated with linearly polarized light from a mercury lamp and detected at crossed polarization to reject the excitation beam. Blue, green, yellow, red and infrared segregated crystals have been observed, and may be associated with the discretely sized family of uniform particles according to the invention. Rotating the sample caused no change, confirming that the color dispersion is due to depolarized luminescence and not to birefringence.

We determined the size of the particles by direct imaging using high-resolution transmission electron microscopy. A thin graphite grid was coated with the particles by immersion in the colloid and quickly transferred to the vacuum compartment of the transmission electron microscope. Results showed that particles are nearly spherical and classify into a small number of sizes. These include the 1.0 (blue), 1.67 (green), 2.15 (yellow), 2.9 (red), and 3.7 (infrared) nm.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

What is claimed is:

1. Elemental silicon formed into a family of discretely and uniformly sized elemental silicon nanoparticles, the family consisting of one or a combination of discrete sizes of 1, 1.67, 2.15, 2.9, and 3.7 nanometer nanoparticles.

* * * * *

UNITED STATES PATENT AND TRADEMARK OFFICE
CERTIFICATE OF CORRECTION

| | |
|---|---|
| PATENT NO. | : 7,001,578 B2 |
| APPLICATION NO. | : 10/829486 |
| DATED | : February 21, 2006 |
| INVENTOR(S) | : Nayfeh et al. |

Page 1 of 1

It is certified that error appears in the above-identified patent and that said Letters Patent is hereby corrected as shown below:

In the Issued Patent:

Col. 1, line 25, after "occurring," please delete "element" and insert -- elemental-- therefor.

Signed and Sealed this

Twenty-ninth Day of August, 2006

JON W. DUDAS
*Director of the United States Patent and Trademark Office*